(12) United States Patent
Zhao et al.

(10) Patent No.: US 8,144,516 B2
(45) Date of Patent: Mar. 27, 2012

(54) DYNAMIC PASS VOLTAGE FOR SENSE OPERATION IN A MEMORY DEVICE

(75) Inventors: Yijie Zhao, Boise, ID (US); Akira Goda, Boise, ID (US); Jian Li, Boise, ID (US); Haitao Liu, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 166 days.

(21) Appl. No.: 12/630,332

(22) Filed: Dec. 3, 2009

(65) Prior Publication Data

US 2011/0134697 A1    Jun. 9, 2011

(51) Int. Cl.
*G11C 16/04* (2006.01)
(52) U.S. Cl. .......... 365/185.12; 365/185.22; 365/185.18
(58) Field of Classification Search ............. 365/185.12, 365/185.22, 185.18, 185.21
See application file for complete search history.

(56) References Cited

U.S. PATENT DOCUMENTS

| 2009/0034337 | A1 | 2/2009 | Aritome |
| 2009/0073763 | A1* | 3/2009 | Hosono .............. 365/185.03 |
| 2009/0135654 | A1 | 5/2009 | Aritome |

OTHER PUBLICATIONS

"Non-Volatile Memory Apparatus and Methods," inventor Paul A. Ruby, U. S. Appl. No. 12/573,606, filed Oct. 5, 2009 (26 pages).

\* cited by examiner

*Primary Examiner* — Huan Hoang
(74) *Attorney, Agent, or Firm* — Leffert Jay & Polglaze, P.A.

(57) ABSTRACT

Methods for sensing and memory devices are disclosed. One such method for sensing uses a dynamic pass voltage on at least one adjacent memory cell that is adjacent to a selected memory cell for programming. If the adjacent memory cell is not programmed, the pass voltage is reduced on the adjacent memory cell. The adjacent memory cell can be on the drain side, the source side, or both drain and source sides of the selected memory cell.

29 Claims, 10 Drawing Sheets

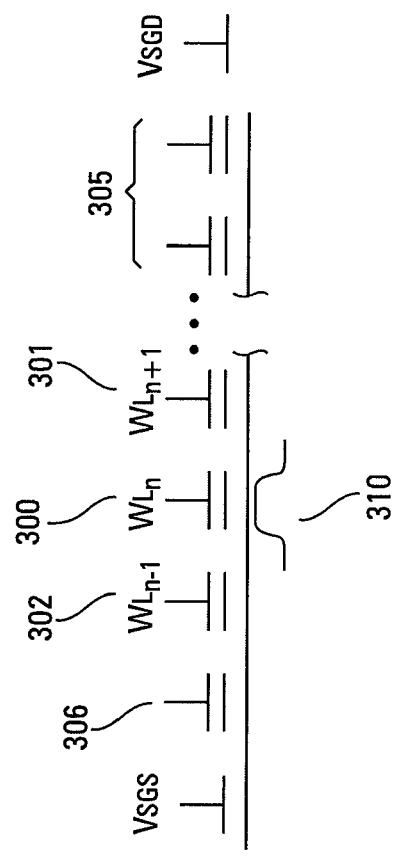
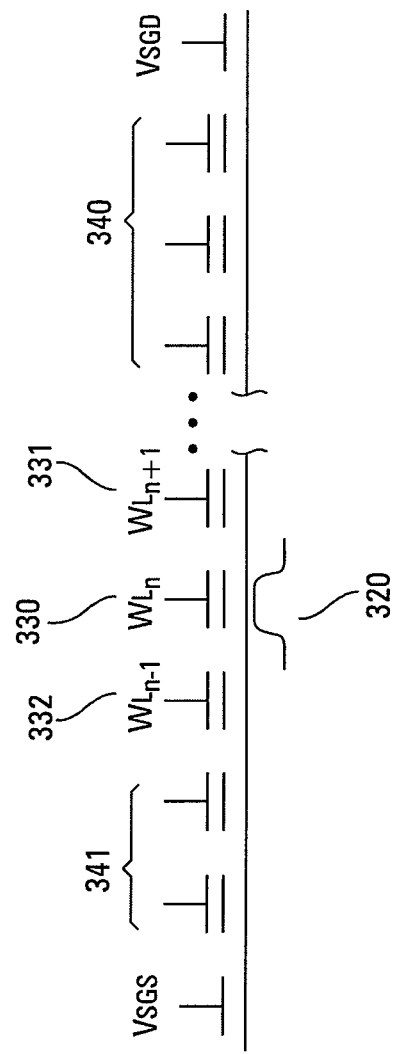

| | POSITIVE $V_t$ SHIFT DUE TO FGFG ($V_t$ of $WL_{n+1}$) | NEGATIVE $V_t$ SHIFT DUE TO WLFG (BIAS AT $WL_{n+1}$) |
|---|---|---|
| CELL A | HIGH | HIGH |
| CELL B | LOW | LOW | though other methods of sensing are known. Smith[1] and Jones[2,3]

DYNAMIC PASS VOLTAGE FOR SENSE OPERATION IN A MEMORY DEVICE

TECHNICAL FIELD OF THE INVENTION

The present invention relates generally to memory and in a particular embodiment the present invention relates to non-volatile memory.

BACKGROUND OF THE INVENTION

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

The channel length of a floating gate flash memory cell refers to the length of the substrate region between source and drain junctions that is controlled by the memory cell's floating gate. In order to increase the memory density of memory devices, the physical channel length can be shortened to fit more memory cells within a certain area of real estate. The effective channel length may also be shortened as a result of undesirable electrical characteristics of memory cells.

As the channel length of a memory cell decreases, either physically or effectively, the source and drain regions of the memory cell become effectively closer to each other. This can cause undesirable short channel effects. For example, a short channel effect known as "punch through" occurs when a high drain voltage causes uncontrolled current (i.e., current that is not controlled by the memory cell's floating gate) to flow. Drain induced barrier lowering ("DIBL") is another undesirable short channel effect that can occur when effective channel length decreases. As a result of DIBL, the memory cell's effective threshold voltage decreases which undesirably affects the performance of the memory cell.

FIGS. 1A and 1B illustrate a typical prior art read operation. FIG. 1A shows the prior art read operation of a memory cell 100 at word line WLn. In this example, the memory cells 101, 103 at WLn−1 and WLn+1 are assumed to be programmed. A representation of the effective channel length 110 is shown under the WLn memory cell 100.

FIG. 1B shows the prior art read operation of a memory cell 121 on WLn in which the adjacent memory cells 120, 122 on WLn−1 and WLn+1 are erased. The representation of the effective channel length 120 is shown as being substantially shorter than that of the programmed adjacent memory cells of FIG. 1A. Thus, erased adjacent memory cells can result in a shorter effective channel length during a read operation.

One method that has been used to reduce the effects of the shorter effective channel length is typically referred to as the corrective read operation. The corrective read method involves dynamically changing only the WLn bias during the read operation to compensate for floating gate-to-floating gate shift. One problem with this method is that it does not compensate for floating gate-to-floating gate coupling variations.

For the reasons stated above, and for other reasons stated below that will become apparent to those skilled in the art upon reading and understanding the present specification, there is a need in the art to reduce the effects of erased memory cells during a sense operation.

BRIEF DESCRIPTION OF THE DRAWINGS

FIGS. 3A and 3B show a portion of a series string of memory cells during a sense operation with dynamically adjusted pass voltages.

DETAILED DESCRIPTION

Figure 1B:
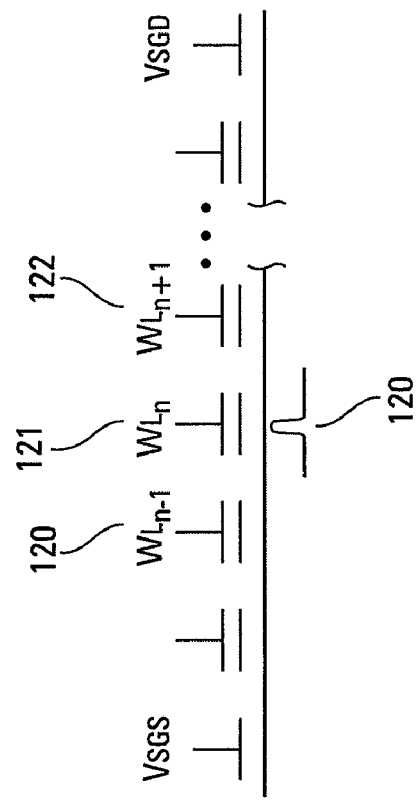
FIGS. 1A and 1B show a typical prior art read operation and resulting effective channel length with both programmed and erased adjacent memory cells.
Figure 1A:
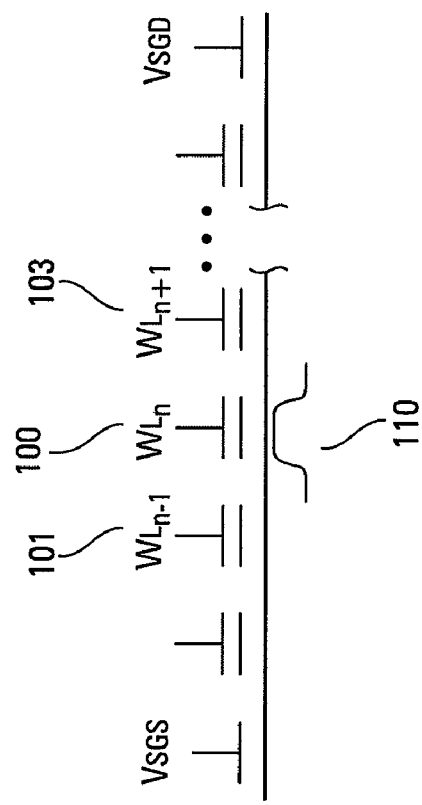

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
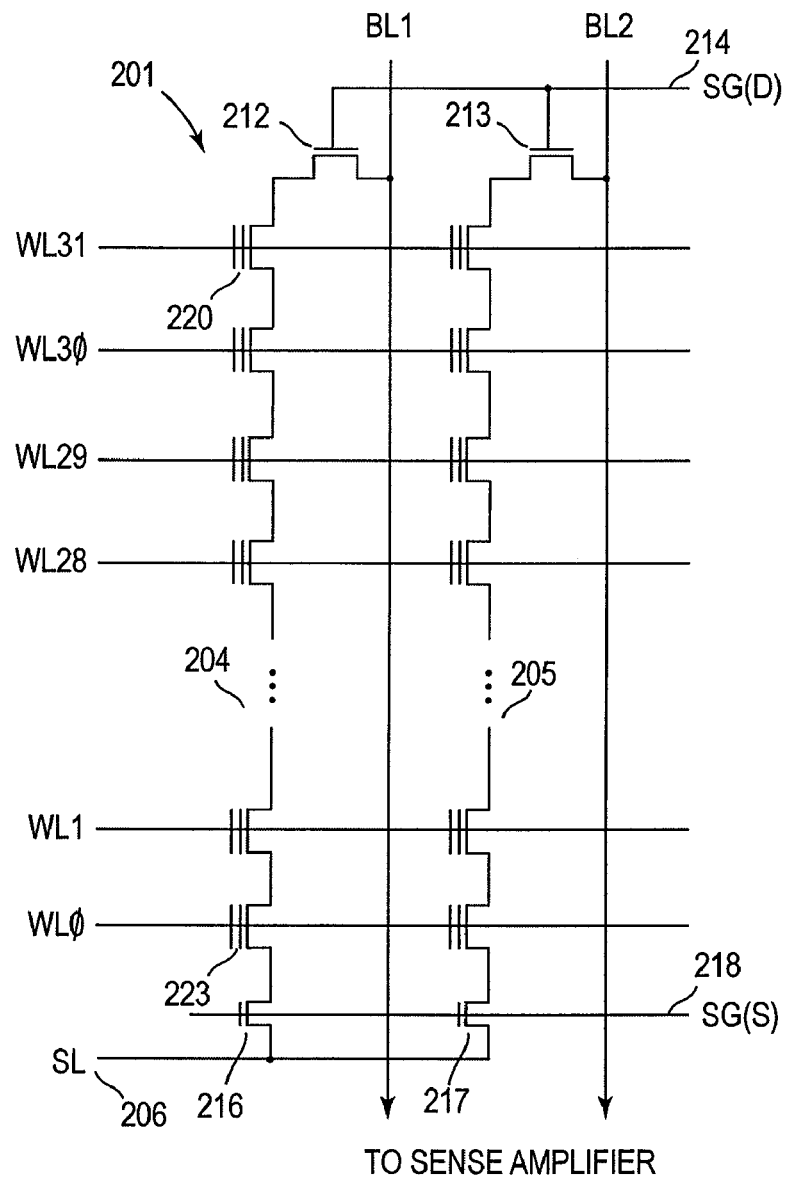
FIG. 2 shows a schematic diagram of one embodiment of a portion of a NAND architecture memory array that can incorporate a method for dynamic pass voltage adjustment of the present embodiments.

FIG. 2 illustrates a schematic diagram of a portion of a NAND architecture memory array 201 comprising series strings of non-volatile memory cells. While FIG. 2 and the subsequent discussions refer to a NAND memory device, the present embodiments are not limited to such an architecture but can be used in other memory device architectures as well (e.g., NOR, AND).

The memory array 201 is comprised of an array of non-volatile memory cells (e.g., floating gate) arranged in columns such as series strings 204, 205. Each of the cells are coupled drain to source in each series string 204, 205. An access line (e.g. word line) WL0-WL31 that spans across multiple series strings 204, 205 is connected to the control gates of each memory cell in a row in order to bias the control gates of the memory cells in the row. The data lines (e.g., bit lines) BL1, BL2 are eventually connected to sense circuits that detect the state of each cell by sensing voltage or current on a particular bit line. The sense circuits are shown and described subsequently with reference to FIG. 3.

Each series string 204, 205 of memory cells is coupled to a source line 206 by a source select gate 216, 217 and to an individual bit line BL1, BL2 by a drain select gate 212, 213. The source select gates 216, 217 are controlled by a source select gate control line SG(S) 218 coupled to their control gates. The drain select gates 212, 213 are controlled by a drain select gate control line SG(D) 214.

Each memory cell can be programmed as a single level cell (SLC) or multiple level cell (MLC). Each cell's threshold voltage ($V_t$) is indicative of the data that is stored in the cell. For example, in an SLC, a $V_t$ of 0.5V might indicate a programmed cell while a $V_t$ of −0.5V might indicate an erased cell. The MLC can have multiple $V_t$ voltage ranges that each indicate a different state.

The following embodiments describe a sense operation on non-volatile memory cells, such as those illustrated in FIG. 2. A sense operation can include such operations as a memory read operation for reading data from a memory cell and a program verify operation that verifies the accuracy of programming target data to a memory cell.

The following embodiments additionally describe the biasing of the word lines in order to bias the individual memory cells coupled to that particular word line. As seen in FIG. 2, biasing the word line ultimately biases the individual memory cells coupled to that particular word line in the row.

FIG. 3A illustrates a portion of a series string of memory cells that are biased for a sense operation. In this embodiment, it is assumed that the memory cell 300 to be sensed is coupled to word line $WL_n$. The memory cells 301, 302 adjacent to the sensed memory cell 300 are both assumed to be programmed. These memory cells are coupled to word lines $WL_{n-1}$ on the source side of $WL_n$ and $WL_{n+1}$ on the drain side of $WL_n$.

Word line $WL_n$ is biased at a sense voltage $V_S$ (e.g., 0V to 5V) in order to turn on the memory cell being sensed 300. The word lines $WL_{n-1}$ and/or $WL_{n+1}$ of the adjacent memory cells 301, 302 are biased at a relatively high pass voltage $V_H$ as compared to the remaining memory cells 305, 306 of the series string of memory cells. For example, $V_H$ might be approximately 6.5V while the remaining word lines are biased at a pass voltage of approximately $V_{pass}$=6V. The sense voltage and pass voltages couple the selected memory cell to sense circuitry, such as sense amplifiers, for reading/verifying the program status of the selected memory cell. Since the adjacent memory cells 301, 302 are programmed, the effective channel length 310 is illustrated as being relatively long.

FIG. 3B illustrates a portion of a series string of memory cells that are biased for a sense operation. This embodiment assumes that the selected memory cell 330 for sensing is coupled to word line $WL_n$ and the adjacent memory cells 331, 332, coupled to word lines $WL_{n+1}$ and $WL_{n-1}$ respectively, are erased.

For the sense operation, $WL_n$ is biased at a sense voltage (e.g., 0V to 5V) while the word lines $WL_{n+1}$ and/or $WL_{n-1}$ are biased at a relatively low pass voltage $V_L$. In one embodiment, $V_L$ is approximately 3V. The word lines of the remaining memory cells 340, 341 of the series string of memory cells are biased at a pass voltage of approximately $V_{pass}$=6V.

FIG. 3B shows that the lower pass voltage on erased, adjacent memory cells results in an effective channel length that is relatively close to the effective channel length of the embodiment of FIG. 3A having programmed adjacent memory cells. This can result in a reduction of undesirable short channel effects.

Figure 4:
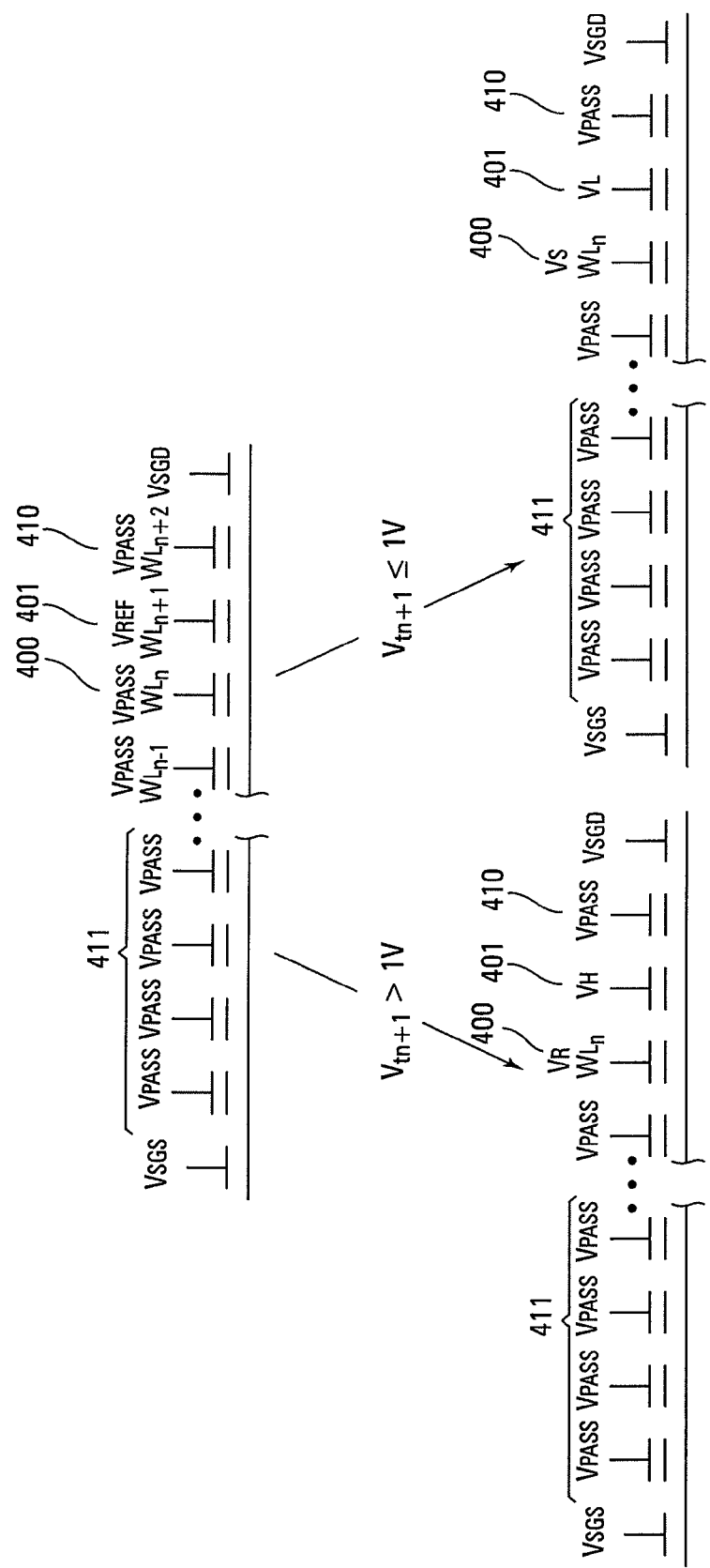
FIG. 4 shows one embodiment of an implementation of the embodiment of FIGS. 3A and 3B.

FIG. 4 illustrates one implementation of the embodiment of FIGS. 3A and 3B. The embodiment of FIG. 4 determines the program status of at least one of the adjacent memory cells prior to a sense operation of the selected memory cell 400 of $WL_n$. In the illustrated embodiment, the program status of the memory cell 401 coupled to $WL_{n+1}$ is determined prior to the sense operation.

This can be accomplished by biasing the word line $WL_{n+1}$ coupled to the adjacent memory cell 401 with a $V_{REF}$ voltage of approximately 1V while the remaining word lines 400, 410, 411 are biased at a pass voltage, $V_{PASS}$, of approximately 6.5V. If $V_{tn+1}$ of the memory cell 401 coupled to $WL_{n+1}$ is greater than or equal to a certain $V_{REF}$ voltage (e.g., 1V), the memory cell 401 remains turned off. If $V_{tn+1}$ is less than the $V_{REF}$ voltage, the $V_{REF}$ voltage turns on the memory cell 401. A memory cell having a threshold voltage less than approximately 1V indicates that the memory cell is not programmed and probably has a negative threshold voltage. A memory cell having a threshold voltage greater than or equal to approximately 1V indicates that the memory cell is programmed.

If the adjacent memory cell 401 is programmed, the relatively high pass voltage $V_H$ is used to bias the $WL_{n+1}$ word line during a sense operation of the selected cell 400. In one embodiment, $V_H$ is approximately 6V. If the adjacent memory cell 401 is not programmed, the relatively low pass voltage $V_L$ is used to bias the $WL_{n+1}$ word line during a sense operation of the selected cell. In one embodiment, $V_L$ is approximately 3V. In one embodiment, the voltages have the following relationships: $V_L<V_{Sn}<$max $V_{tn}<V_H$ and $V_L>V_{REF}$, where $V_{Sn}$ is the sense voltage to sense the threshold voltage of the memory cell coupled to the $WL_n$ word line and the maximum $V_{tn}$ is the highest voltage level to which the memory cell coupled to the WLn word line should be programmable.

Variations on the embodiment of FIG. 4 can also be performed to determine the program status of memory cells adjacent to the memory cell to be sensed. For example, the program status determination and the $V_H/V_L$ pass voltages can be performed only on $WL_{n-1}$, $WL_{n-1}$ and $WL_{n+1}$ together, or $WL_{n-1}$ and $WL_{n+1}$ independently. As previously described, the embodiments of FIG. 4 and these variations can be performed for any sense operation whether a memory read or a program verify.

Figure 5:
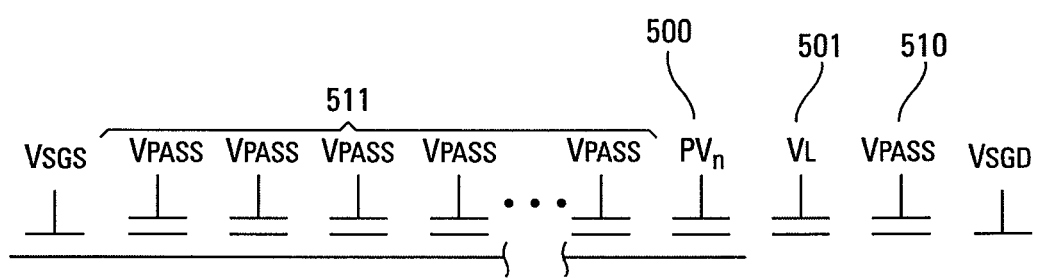
FIG. 5 shows another embodiment of an implementation of the embodiment of FIGS. 3A and 3B.

FIG. 5 illustrates another embodiment of an implementation of the embodiment of FIG. 3. This embodiment likely works best for a program verify sense operation due to the voltages involved. The word line of the memory cell 500 undergoing the program verify is biased at a program verify voltage $PV_n$ and state n has not yet been programmed. The voltage level of $PV_n$ is determined in response to the program state being verified. In other words, assuming that the memory cell 500 can be programmed to four different states (i.e., n=4), $PV_n$ (each being within one of four respective voltage ranges that are respectively indicative of four different programmable states) is based on to which of these levels the memory cell 500 is being verified.

The word line of the adjacent memory cell 501 (coupled to $WL_{n+1}$) is biased at a low pass voltage $V_L$. $V_L$ can be lower than the maximum $V_t$ for level n (max $V_{tn}$) because state n has not yet been programmed to the adjacent cell 501. In one embodiment, this voltage is approximately 1V for a SLC. Another embodiment might use approximately 4.5V for a MLC.

Figure 6:
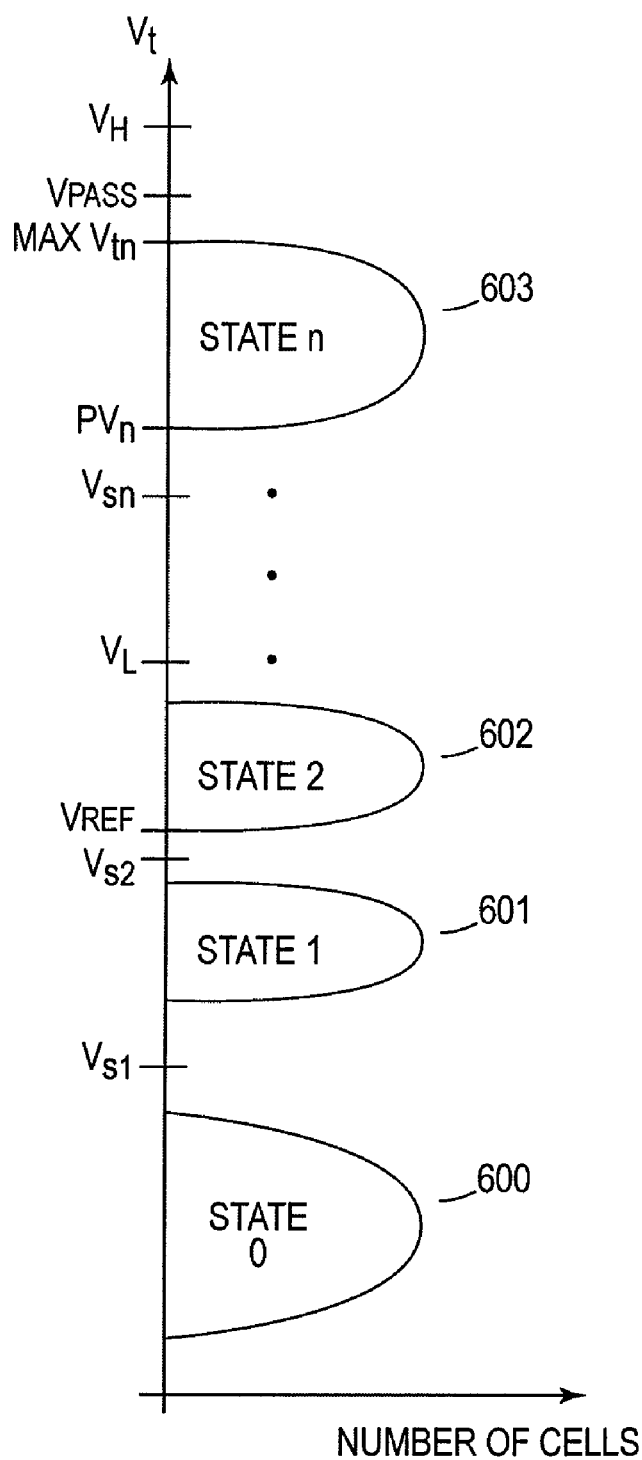
FIG. 6 shows the relationship of the program verify voltages used in the embodiment of FIG. 5.

FIG. 6 illustrates the relationship of the voltages of the embodiments of FIGS. 3-5 as they relate to the various voltage ranges for the programmable states of a memory cell. This embodiment illustrates an MLC memory cell that is programmable to n states 600-603.

Assuming n is the maximum programmable state, it can be seen from FIG. 6 that $PV_n$ is at the lowest voltage of state n 603 being program verified. The low pass voltage $V_L$ is approximately mid-level. $V_{PASS}$ is larger than any of the states 600-603. $V_{S1}$ is a sense voltage for state 1, $V_{S2}$ is a sense voltage for state 2, and $V_{Sn}$ is a sense voltage for state n. $V_L$ is less than the maximum $V_t$ for level n (max $V_m$). $V_L$ is less than $V_{Sn}$ (sense voltage for state n). $V_L$ is greater than $V_{REF}$ (sense voltage during WLn+1 check).

The concept of the embodiments of FIGS. 3-5 can also be applied to an SLC memory cell that is programmable to only two states. An SLC embodiment would use a lower $V_L$ voltage. In one embodiment, $V_L$ is approximately 1 V.

Figure 7:
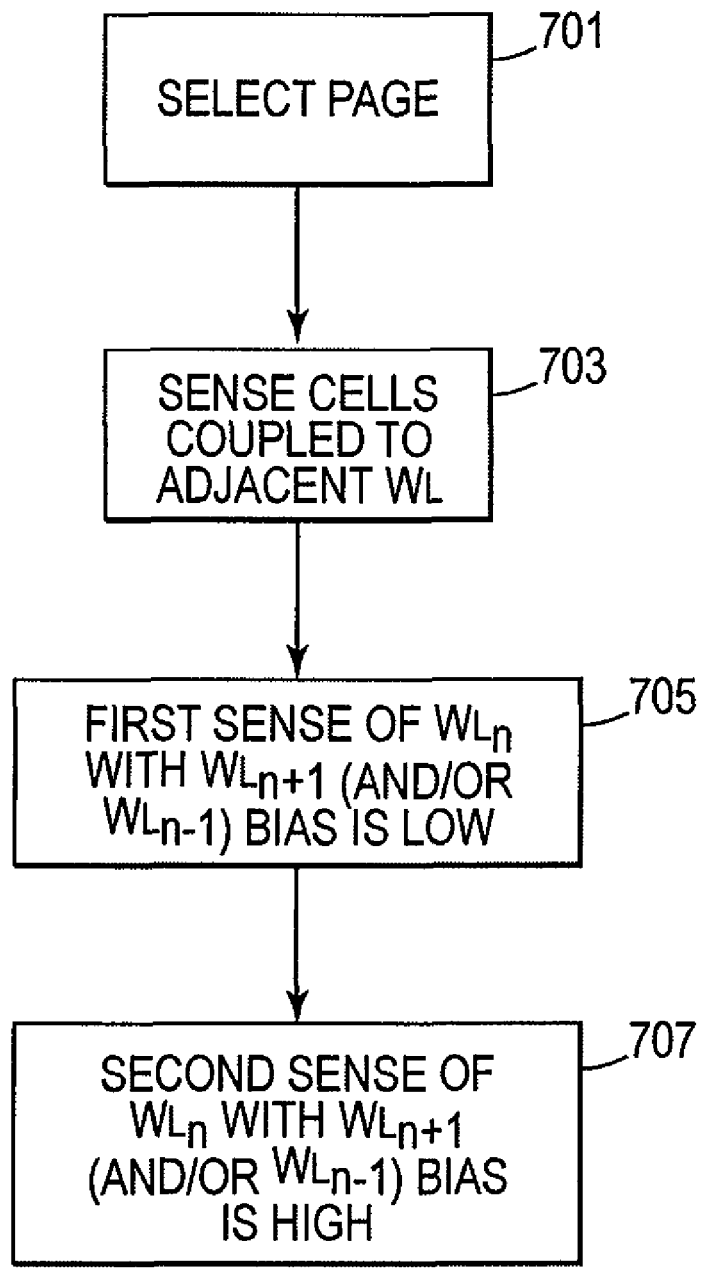
FIG. 7 shows a flowchart of one embodiment of a method for dynamic pass voltage adjustment.

FIG. 7 illustrates a flowchart of another embodiment of the method for dynamic pass voltage adjustment during a sense operation. This embodiment adjusts the pass voltage for adjacent word line $WL_{n+1}$, during a sense operation, based on a state of an upper page of a memory cell coupled to $WL_{n+1}$. In one embodiment, the $V_t$ status means that the $V_t$ is higher or lower than a particular absolute $V_t$ value. In another embodiment, the $V_t$ status means the upper page is a logical "0" (programmed" or a logical "1" (erased). The $WL_n$ sense operation is performed multiple times with a varying $WL_{n+1}$ (and/or $WL_{n-1}$ in another embodiment).

The upper page of a memory cell that is coupled to the $WL_{n+1}$ word line is programmed after a memory cell coupled to the $WL_n$ word line. The programming of the upper page of the $WL_{n+1}$ memory cell causes the $V_t$ distribution of the $WL_n$ memory cell to shift due to floating gate-to-floating gate coupling. Thus, during a sense operation, a higher pass voltage is used to bias, for example, $WL_{n+1}$ (and/or $WL_{n-1}$) during sensing of the memory cell(s) of $WL_n$ that is respectively adjacent to a memory cell(s) whose upper page has been programmed than is used during sensing of a memory cell(s) of $WL_n$ that is respectively adjacent to a memory cell(s) whose upper page has not yet been programmed.

The page being sensed is selected 701 by biasing word line $WL_n$ so that the selected memory cells being sensed are biased at a sense voltage $V_S$ that depends on a program level being sensed. The memory cells coupled to word lines adjacent to $WL_n$ are sensed 703. The adjacent word lines can include $WL_{n+1}$ and/or $WL_{n-1}$. In one embodiment, the $V_t$ is checked to determine if it is higher or lower than a particular $V_t$. In another embodiment, the upper page $V_t$ status is checked.

The selected word line $WL_n$ is sensed a first time 705 by biasing $WL_n$ with $V_S$ and biasing $WL_{n+1}$, and/or $WL_{n-1}$ in another embodiment, at $V_L$ (e.g., 6V). This senses the $WL_n$ memory cells that have adjacent cells programmed low (lower than a predetermined $V_t$ or upper page is not programmed). In another embodiment, the first sense senses the $WL_n$ memory cells that have adjacent memory cells having an erased upper page (e.g., upper page is logical "1").

The selected word line $WL_n$ is biased a second time 707 with the $V_S$ bias but this time word line $WL_{n+1}$ (and/or $WL_{n-1}$) is biased at $V_H$ (e.g., 7V) to sense the memory cell(s) of the selected word line $WL_n$ that is/are adjacent to a memory cell(s) whose upper page has been programmed (e.g., upper page of adjacent cells is logical "0"). In another embodiment, this second sense determines which adjacent memory cells have an upper page that is erased (e.g., upper page of adjacent cells is logical "1"). Accordingly, the $WL_{n+1}$ pass voltage is dynamically adjusted from the lower voltage (e.g., 6V) to the higher voltage (e.g., 7V) during the sense operation.

FIG. 10 illustrates the benefits of the embodiment of FIG. 7. The plot illustrates a comparison between a plot of the shift of the $WL_n$ $V_t$ distributions using the embodiment of FIG. 7 and the $V_t$ distributions using a typical prior art method of sensing. The embodiment of FIG. 7 can improve both median distribution and $V_1$ overshoot.

Figures 10A, 10B:
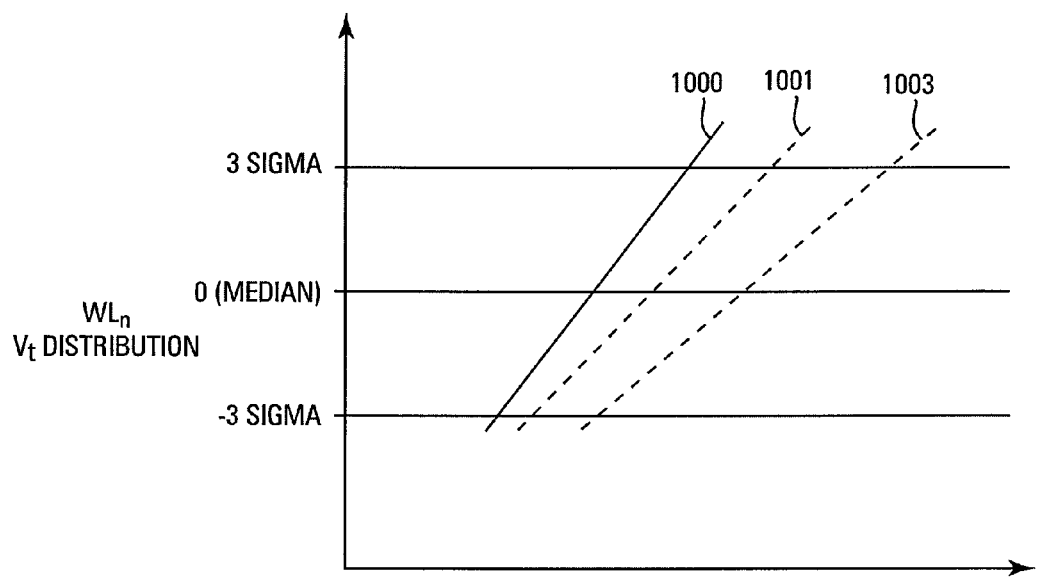
FIGS. 10A and 10B show a plot and table of how a $V_t$ distribution shifts before and after adjacent WL programming in accordance with the embodiment of FIG. 7 in comparison to a typical prior art sense operation.

FIG. 10A shows the plot of $WL_n$ $V_t$ distributions 1000 after the memory cells of $WL_n$ have been programmed. Another plot 1001 shows the $WL_n$ distributions when the memory cells of the upper page of $WL_{n+1}$ are programmed after $WL_n$. The $V_t$ distribution on $WL_n$ is shifted after programming the upper page on $WL_{n+1}$ due to floating gate-to-floating gate coupling. The prior art plot 1003 of the distributions after programming $WL_{n+1}$ is shown for comparison.

This improvement is from a self compensation effect of floating gate-to-floating gate coupling variation. As shown in FIG. 10B, if a particular cell has higher floating gate-to-floating gate coupling due to structure variation such as floating gate height or cell to cell space, $V_t$ of this cell moves more positively after $WL_{n+1}$ cell is programmed. On the other hand, the same cell has higher word line-to-floating gate coupling due to the same structure reasons. As a result, $V_t$ moves more negatively when higher $WL_{n+1}$ voltage is applied during read. Those two effects compensate each other and reduce $V_t$ shift variation.

Figure 8:
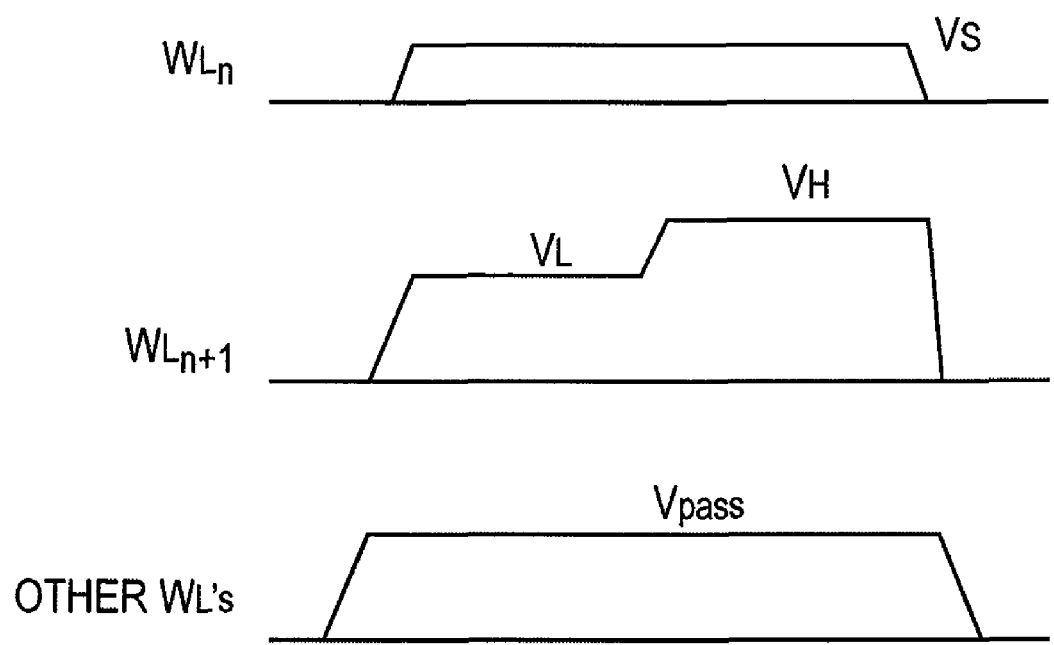
FIG. 8 shows a timing diagram of a sense operation in accordance with the embodiment of FIG. 7.

FIG. 8 shows the relationships of the sense voltages for the embodiment of FIG. 7. The selected word line $WL_n$ is biased at $V_S$ during the sense operation. The pass voltage on the adjacent word line $WL_{n+1}$ is initially the lower $V_L$ pass voltage then increases to the higher $V_H$ voltage. During this time, the remaining unselected word lines of the series string of memory cells are biased at pass voltage $V_{PASS}$.

Figure 9:
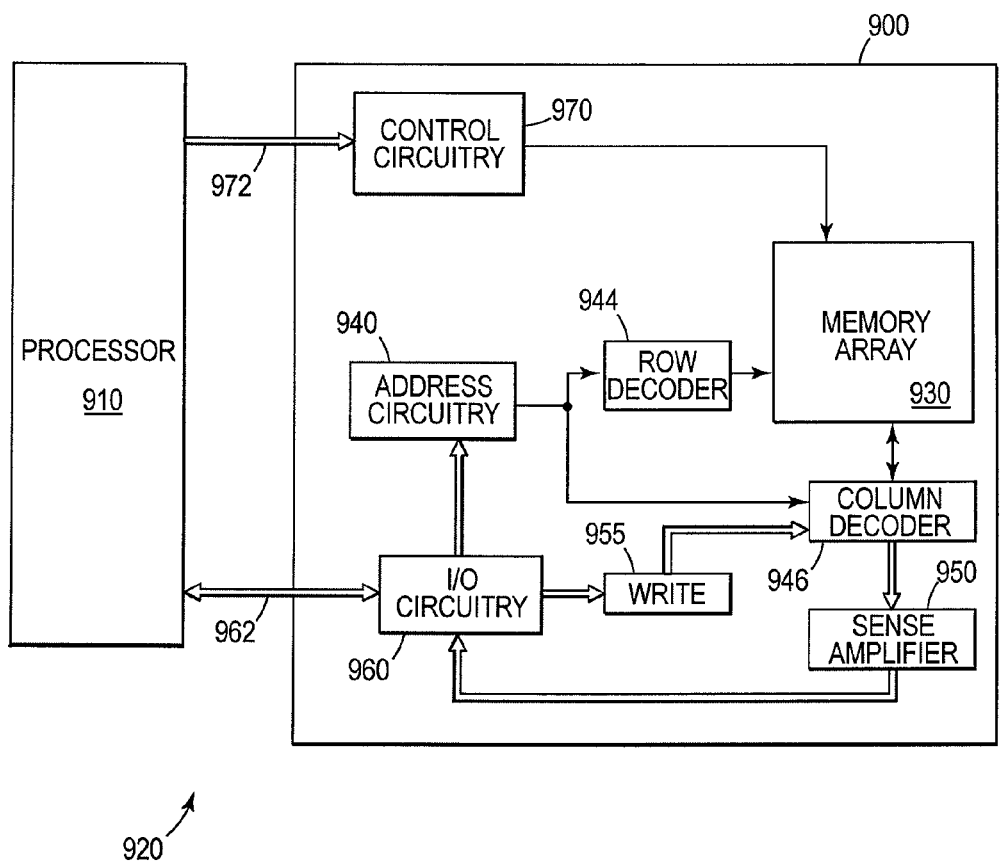
FIG. 9 shows a block diagram of one embodiment of a memory system in accordance with the method for dynamic pass voltage adjustment of FIG. 3.

FIG. 9 illustrates a functional block diagram of a memory device 900. The memory device 900 is coupled to an external controller 910. The controller 910 may be a microprocessor or some other type of controlling circuitry. The memory device 900 and the controller 910 form part of a memory system 920. The memory device 900 has been simplified to focus on features of the memory that are helpful in understanding the present invention.

The memory device 900 includes an array 930 of non-volatile memory cells, such as the one illustrated previously in FIG. 2. The memory array 930 is arranged in banks of word line rows and bit line columns. In one embodiment, the columns of the memory array 930 are comprised of series strings of memory cells as illustrated in FIG. 2. As is well known in the art, the connections of the cells to the bit lines determines whether the array is a NAND architecture, an AND architecture, or a NOR architecture.

Address buffer circuitry 940 is provided to latch address signals provided through the I/O circuitry 960. Address signals are received and decoded by a row decoder 944 and a column decoder 946 to access the memory array 930. It will be appreciated by those skilled in the art, with the benefit of the present description, that the number of address input connections depends on the density and architecture of the memory array 930. That is, the number of addresses increases with both increased memory cell counts and increased bank and block counts.

The memory device 900 reads data in the memory array 930 by sensing voltage or current changes in the memory array columns using sense circuitry. The sense circuitry, in one embodiment, is coupled to read and latch a row of data from the memory array 930. Data input and output buffer circuitry 960 is included for bidirectional data communication as well as address communication over a plurality of data connections 962 with the controller 910. Write circuitry 955 is provided to write data to the memory array.

Memory control circuitry 970 decodes signals provided on control connections 972 from the external controller 910.

These signals are used to control the operations on the memory array 930, including data read, data write (program), and erase operations. The memory control circuitry 970 may be a state machine, a sequencer, or some other type of control circuitry to generate the memory control signals. In one embodiment, the memory control circuitry 970 is configured to control generation of memory control signals that include execution of the embodiments of the sense operation of the present disclosure.

The flash memory device illustrated in FIG. 9 has been simplified to facilitate a basic understanding of the features of the memory. A more detailed understanding of internal circuitry and functions of flash memories are known to those skilled in the art.

CONCLUSION

In some of the disclosed embodiments, a pass voltage adjusts, in response to a memory cell's program status (e.g., the pass voltage that biases the memory cells adjacent to a memory cell being sensed). If the adjacent memory cell(s) is/are programmed, the pass voltage used on these memory cells is higher than the pass voltage used if they are not programmed (e.g., erased). When a memory cell on word line $WL_n$ is being sensed, a lower pass voltage on word lines $WL_{n+1}$ and/or $WL_{n-1}$ should create an effective channel length under the $WL_n$ memory cell that is substantially close to the effective channel length under a $WL_n$ memory cell having programmed adjacent memory cells.

What is claimed is:

1. A method for sensing a selected memory cell, the method comprising:
    biasing the selected memory cell at a sense voltage; and
    biasing at least one memory cell, that is adjacent to the selected memory cell, at a pass voltage that is determined responsive to a program status of the at least one adjacent memory cell wherein the pass voltage for the at least one adjacent memory cell is less than a maximum $V_{tn}$ voltage, wherein the n state is a maximum programmable state of the selected memory cell and the pass voltage for the at least one adjacent memory cell is less than the sense voltage for the n state.

2. The method of claim 1 wherein the at least one adjacent memory cell is adjacent to the selected memory cell on a drain side of the selected memory cell in a series string of memory cells.

3. The method of claim 1 wherein the at least one adjacent memory cell is adjacent to the selected memory cell on a source side of the selected memory cell in a series string of memory cells.

4. The method of claim 1 wherein the at least one adjacent memory cell comprises adjacent memory cells on both a source side and a drain side of the selected memory cell in a series string of memory cells.

5. The method of claim 1 wherein if the program status of the at least one adjacent memory cell indicates an erased state, the pass voltage is less than if the program status indicates a programmed state.

6. The method of claim 1 wherein if the program status of the at least one adjacent memory cell indicates that an upper page is programmed, biasing the at least one adjacent memory cell comprises biasing the at least one adjacent memory cell at a higher pass voltage than if the program status indicated that the upper page was not programmed.

7. The method of claim 1 wherein if the program status of the at least one adjacent memory cell indicates that an upper page is not programmed, biasing the at least adjacent memory cell comprises biasing the at least one adjacent memory cell at a lower pass voltage than if the program status indicated that the upper page was programmed.

8. A method for sensing a selected memory cell, the method comprising:
    biasing the selected memory cell at a sense voltage; and
    biasing at least one memory cell, that is adjacent to the selected memory cell, at a pass voltage that is determined responsive to a program status of the at least one adjacent memory cell wherein the pass voltage for the adjacent memory cell is greater than a reference voltage used in determining the program status of the at least one adjacent memory cell.

9. A method for sensing a selected memory cell, the method comprising:
    determining a program status of a memory cell adjacent to the selected memory cell prior to sensing the selected memory cell;
    biasing the selected memory cell with a sense voltage; and
    biasing the adjacent memory cell with a pass voltage responsive to the program status of the adjacent memory cell wherein the pass voltage includes a range of voltages that include a high pass voltage that is greater than the pass voltage, a maximum threshold voltage for an n state that is less than the high pass voltage, and a program verify voltage for the n state that is less than the maximum threshold voltage wherein the n state is a highest programmable state of the selected memory cell.

10. The method of claim 9 wherein the selected memory cell is a single level cell configured to store a single bit of data.

11. The method of claim 9 wherein the selected memory cell is a multiple level cell configured to store a plurality of bits of data.

12. The method of claim 9 wherein the sensing is a memory read operation.

13. The method of claim 9 wherein the sensing is a program verify operation and the sense voltage is a program verify voltage.

14. The method of claim 9 wherein the selected memory cell is coupled to access line $WL_n$ and the adjacent memory cell is coupled to access line $WL_{n+1}$ and the selected memory cell and adjacent memory cell are biased in response to biasing of the $WL_n$ and $WL_{n+1}$ access lines.

15. The method of claim 14 wherein the adjacent memory cell comprises a memory cell coupled to the $WL_{n+1}$ access line and a memory cell coupled to the $WL_{n-1}$ access line.

16. The method of claim 9 wherein the pass voltage is higher for program status of programmed than of programmed status of not programmed.

17. The method of claim 16 wherein determining a program status comprises biasing the adjacent memory cells with a reference voltage.

18. The method of claim 9 wherein the program status is one of an absolute threshold voltage or an upper page program status.

19. A method for sensing a selected memory cell, the method comprising:
    determining, using a reference voltage, whether the upper page of a memory cell adjacent to a selected memory cell is programmed;
    if an upper page of the adjacent memory cell is not programmed, performing the sensing of the selected memory cell while biasing the adjacent memory cell with a first voltage; and if the upper page of the adjacent memory cell is programmed, performing the sensing of the selected memory cell while biasing the adjacent memory cell with a second voltage;

wherein the first and second voltages are greater than the reference voltage.

20. The method of claim 19 wherein the second voltage is greater than the first voltage.

21. The method of claim 20 wherein biasing the adjacent memory cell comprises:

sequentially biasing the adjacent memory cell at the first voltage then the second voltage during a sensing operation.

22. A memory device comprising:

a memory array comprising a plurality of memory cells configured into series strings of memory cells; and control circuitry coupled to the memory array and configured to bias a control gate of at least one memory cell that is adjacent to a memory cell selected for sensing with a first pass voltage when the at least one adjacent memory cell is not programmed and with a second pass voltage when the at least one adjacent memory cell is programmed, wherein the first pass voltage is lower than the second pass voltage and further wherein the first pass voltage and the second pass voltage are greater than a reference voltage used in determining if the at least one memory cell that is adjacent to the memory cell selected for sensing is programmed.

23. The memory device of claim 22 wherein the memory array is comprised of a NAND architecture.

24. The memory device of claim 22 wherein the at least one adjacent memory cell comprises a first memory cell on a drain side of the selected memory cell and a second memory cell on a source side of the selected memory cell.

25. The memory system of claim 22 wherein the first pass voltage and the second pass voltage are such that an effective channel length under the selected memory cell is substantially the same regardless of whether the adjacent memory cell is programmed.

26. The memory system of claim 22 wherein the control circuitry is further configured to determine a program status of the adjacent memory cell prior to the sense operation and bias the adjacent memory cell with the first pass voltage or the second pass voltage responsive to the determined program status.

27. A method for sensing a selected memory cell of a string of memory cells, the method comprising:

biasing the selected memory cell with a program verify voltage;

biasing only a memory cell adjacent to the selected memory cell with a low pass voltage; and biasing remaining memory cells of the string of memory cells with a high pass voltage that is greater than the low pass voltage wherein the low pass voltage is less than a maximum threshold voltage for an n state of the selected memory cell wherein the n state is a maximum programmable state for the selected memory cell.

28. A method for sensing a selected memory cell of a string of memory cells, the method comprising:

biasing the selected memory cell with a program verify voltage;

biasing only a memory cell adjacent to the selected memory cell with a low pass voltage; and biasing remaining memory cells of the string of memory cells with a high pass voltage that is greater than the low pass voltage wherein the low pass voltage is less than the program verify voltage.

29. The method of claim 28 wherein the adjacent memory cell has not yet been programmed to a maximum programmable state.

* * * * *

UNITED STATES PATENT AND TRADEMARK OFFICE
CERTIFICATE OF CORRECTION

PATENT NO. : 8,144,516 B2
APPLICATION NO. : 12/630332
DATED : March 27, 2012
INVENTOR(S) : Yijie Zhao et al.

It is certified that error appears in the above-identified patent and that said Letters Patent is hereby corrected as shown below:

In column 8, lines 50-51, in Claim 16, delete "programmed" and insert -- program --, therefor.

In column 9, line 35, in Claim 25, delete "system" and insert -- device --, therefor.

In column 10, line 4, in Claim 26, delete "system" and insert -- device --, therefor.

Signed and Sealed this
Fifth Day of June, 2012

David J. Kappos
*Director of the United States Patent and Trademark Office*